United States Patent [19]

Yokozeki et al.

[11] Patent Number: 4,518,443
[45] Date of Patent: May 21, 1985

[54] ACOUSTIC DIAPHRAGM

[75] Inventors: Shinichi Yokozeki; Masami Kimura; Tsunehiro Tsukagoshi, all of Tokorozawa, Japan

[73] Assignee: Pioneer Electronic Corporation, Tokyo, Japan

[21] Appl. No.: 496,534

[22] Filed: May 20, 1983

[30] Foreign Application Priority Data

May 25, 1982 [JP] Japan .................... 57-87214

[51] Int. Cl.³ .......................................... G10K 13/00
[52] U.S. Cl. ................................. 148/400; 181/157; 181/167; 181/168; 420/401
[58] Field of Search ................. 148/400; 420/401; 181/157, 167, 168

[56] References Cited

U.S. PATENT DOCUMENTS

| 1,759,632 | 5/1930 | Scheuch | 420/401 |
| 3,322,514 | 5/1967 | Krock et al. | 420/401 |
| 4,192,695 | 3/1980 | Mahalla | 148/400 |
| 4,254,184 | 3/1981 | Tsukagoshi et al. | 428/408 |

FOREIGN PATENT DOCUMENTS

| 55-46114 | 11/1980 | Japan . | |
| 960008 | 6/1964 | United Kingdom | 420/401 |

Primary Examiner—Veronica O'Keefe

[57] ABSTRACT

An acoustic diaphragm formed of beryllium or an alloy composed mainly of beryllium. Said diaphragm has a crystal structure having its plane ($11\bar{2}0$) preferentially orientated in parallel with the surface of the diaphragm.

1 Claim, 4 Drawing Figures (I)

(II)

(I)

(II)

ACOUSTIC DIAPHRAGM

BACKGROUND OF THE INVENTION

The present invention relates to an acoustic diaphragm formed of beryllium or an alloy composed mainly of beryllium, which is best suited for use in moderate and high-frequency regions.

In the prior art, materials having a high Young's modulus E and a low density ρ, say, a high E/ρ ratio have been found to be best suited for use in acoustic diaphragms.

However, beryllium or an alloy composed mainly of beryllium is brittle and shows poor ductility and processability, so that its pressing or rolling at room temperature is practically impossible.

To this end, such a type of diaphragm has been prepared by means of hot-rolling, hot-pressing or vacuum deposition.

Of these means, hot-pressing or hot-rolling involves a first step of finely chipping (B) a beryllium ingot (A), a second step of pulverizing (C) the resulting chips into a particle size of not more than 200 mesh followed by sieving (D), and a third step of finely pulverizing the resulting particles to form powdery beryllium, as shown in FIG. 1. In a further or fourth step, the powdery beryllium is subjected to vacuum hot-pressing to form a hot-pressed block (F). The block F is sandwiched between plates of, e.g., stainless steel, and welded together on its circumference. In a subsequent or fifth step, hot-rolling (G) is repeated until the product having a desired thickness is obtained.

BACKGROUND OF THE INVENTION

The present invention relates to an acoustic diaphragm formed of beryllium or an alloy composed mainly of beryllium, which is best suited for use in moderate and high-frequency regions.

In the prior art, materials having a high Young's modulus E and a low density ρ, say, a high E/ρ ratio have been found to be best suited for use in acoustic diaphragms.

However, beryllium or an alloy composed mainly of beryllium is brittle and shows poor ductility and processability, so that its pressing or rolling at room temperature is practically impossible.

To this end, such a type of diaphragm has been prepared by means of hot-rolling, hot-pressing or vacuum deposition.

Of these means, hot-pressing or hot-rolling involves a first step of finely chipping (B) a beryllium ingot (A), a second step of pulverizing (C) the resulting chips into a particle size of not more than 200 mesh followed by sieving (D), and a third step of finely pulverizing the resulting particles to form powdery beryllium, as shown in FIG. 1. In a further or fourth step, the powdery beryllium is subjected to vacuum hot-pressing to form a hot-pressed block (F). The block F is sandwiched between plates of, e.g., stainless steel, and welded together on its circumference. In a subsequent or fifth step, hot-rolling (G) is repeated until the product having a desired thickness is obtained. Thereafter, the product is finished into a desired diaphragm shape by hot-pressing.

The thus obtained diaphragm contains a relatively larger amount of impurities such as beryllium oxide. In addition, beryllium tends to be of a crystal structure wherein the plane (0002) is primarily in parallel with the surface of that diaphragm due to the fact that the planes (10$\bar{1}$0) and (0002) provide grinding planes.

With the diaphragm obtained by vacuum deposition, its crystal structure may vary depending upon the deposition conditions such as the material and temperature of the substrate applied, the evaporation rate and the degree of vacuum. For instance, the plane to be in parallel with the surface of that diaphragm may vary from (0002) to (10$\bar{1}$1) and (10$\bar{1}$0) to (10$\bar{1}$3) and (10$\bar{1}$2).

Thus, the diaphragms obtained by the conventional manner possess physical properties represented by, for example, density ρ and Young's modulus E that are found to be satisfactory and sufficient for the acoustic purpose; however, they have unsatisfactory mechanical strength.

SUMMARY OF THE INVENTION

The present invention has been accomplished with a view to eliminating the disadvantages of the prior art, and has for its object the provision of an acoustic diaphragm which is improved in respect its mechanical strength with no fear of damaging its physical properties.

In accordance with the present invention, this object is achieved by the provision of a novel acoustic diaphragm formed of beryllium or an alloy composed mainly of beryllium, characterized by having a crystal structure wherein the plane (11$\bar{2}$0) is preferentially orientated in parallel with the surface of said diaphragm.

BRIEF DESCRIPTION OF THE DRAWINGS

The present invention will now be explained in further detail with reference to the drawings given for the illustration only, in which.

DESCRIPTION OF THE PREFERRED EMBODIMENT

Figure 1:
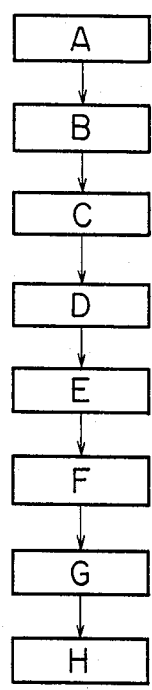
FIG. 1 illustrates the steps of one conventional method for the preparation of beryllium diaphragms.
Figure 2:
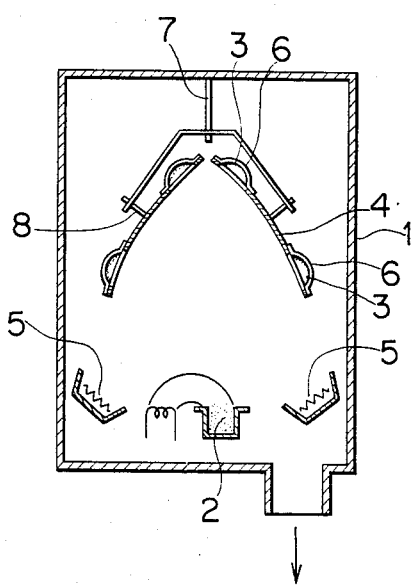
FIG. 2 is a sectional view illustrative of the apparatus for preparing one embodiment of the acoustic diaphragm according to the present invention.

In what follows, the present invention will now be described with reference to the method for the preparation of the inventive acoustic diaphragm together with one typical apparatus used for that purpose.

Within a vacuum vessel or furnace shown at 1, there is a deposition or evaporation source 2 into which an amount of beryllium has a purity of 99.5% or higher. A substrate 3 of Cu or Al is molded into a diaphragm shape, and held within a rotary planetary jig 4, which is then placed within the vacuum furnace 1. The planetary jig 4 is provided therein with a plurality of openings so as to expose the inside of the substrate 3 to view. The jig 4 is also designed to be rotatable around shafts 7 and 8. The temperature prevailing in the vacuum furnace 1 is increased to 400°–600° C. by a heater 5. Beryllium is evaporated from the evaporation source 2 by means of electron beam heating, etc., whereby a film of beryllium is deposited onto the substrate 3.

For the preparation of a beryllium diaphragm, in a first step the substrate 3 molded into a diaphragm shape using a material such aluminum or copper is mounted onto the rotary planetary jig 4 and, thereafter, the vacuum furnace 1 is evacuated to $10^{-4}$–$10^{-6}$ (Torr).

In a second step, the atmosphere in the vacuum furnace 1 is heated by the heater 5 to bring the surface temperature of the substrate 3 up to 400°–600° C., and beryllium is evaporated from the evaporation source 2 with the aid of electron beams, etc. whereby a thin film 6 of beryllium is formed on the substrate 3. Of importance in this second step is a deposition rate regulated in such a manner that the thickness of the resulting beryllium film is on the order of 1 μm. A deposition rate above 1 μm/min. would result in random orientation of crystals. It is thus required to apply an initial deposition rate of not more than 5000 Å/min. in order to have a crystal structure wherein the plane $(11\bar{2}0)$ is kept in parallel with the surface of the diaghragm to be prepared. When a copper substrate is used, metallizing is initiated at a temperature of 400° C., which temperature increases gradually as the metal melts, and reaches about 500° C. at a final point of deposition.

A temperature increase is then about 5°–10° C./min. It is noted that the temperature within the vacuum furnace should be determined taking the heat resistance of the jig, etc. into account.

While the present invention has been explained with reference to the preferred embodiment, it will be understood that many modifications of changes may be made thereto without departing from the scope and spirit as defined in the appended claims.

Figure 3:
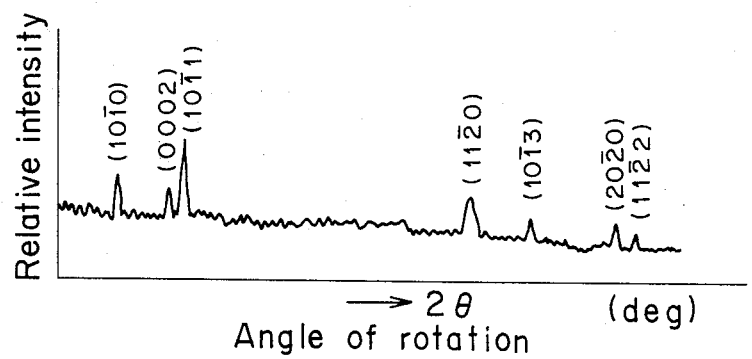
FIGS. 3 and 4 are similar X-ray diffraction charts of the thin films of beryllium deposited at initial deposition rates of 2-3 μm/min. and 2000-3000 Å/min., respectively.
Figure 4:
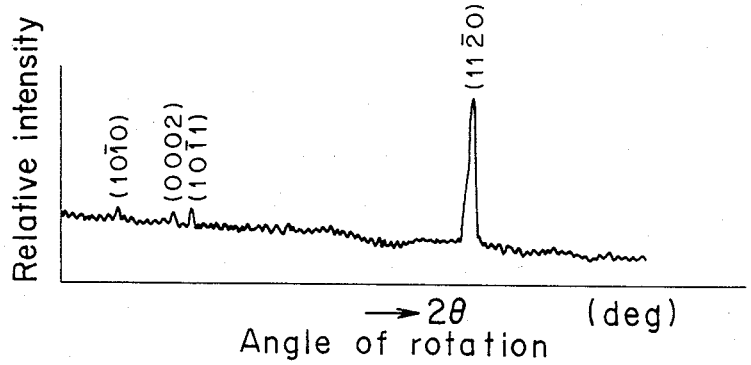

FIGS. 3 and 4 are X-ray diffraction charts I and II of the thin films 6 of beryllium obtained at the initial deposition rates of 2–3 μm/min. and 2000–3000 Å/min., respectively. From the FIG. 3, it is found that the plane $(10\bar{1}1)$ shows a maximum strength, while various planes $(0002)$, $(11\bar{2}0)$ and $10\bar{1}0)$ exhibit considerable strength, and that the resulting crystal structure is random. From the FIG. 4, it is also found that the plane $(11\bar{2}0)$ aligns in parallel with the crystal surface in a considerable proportion.

In a third step, the substrate 3 onto which beryllium has been deposited is discharged from the vacuum furnace 1, and removed from the jig 4 by suitable means such as etching to obtain the end beryllium diaphragm.

In this case, when the substrate 3 is formed of copper, nitric acid is used as an etching liquid while, when it is formed of aluminium, an alkali solution of sodium oxide or hydroxide is used as an etching liquid.

The thus prepared beryllium diaphragm is found to have a Young's modulus of $2.0$–$2.8 \times 10^{11}$ N/m² corresponding to that obtained with the prior art beryllium. However, its tensile strength is found to reach as high as 30–60 kg/mm², while that of the conventional metallized beryllium is only 20–30 kg/mm².

The foregoing preparatory steps also hold for the preparation of beryllium alloy thin diaphragms. As the elements to be added to the beryllium vacuum-deposited onto a substrate, use may be made of aluminum, copper, zinc, titanium, silver and the like. The amount of the elements added varies depending upon their density, and may preferably within, for example, 15% by weight.

While the foregoing embodiment has been described as being applicable to the acoustic diaphragm, it may be applicable to cantilevers or other acoustic parts as well as the preparation of X-ray bulbs' windows due to the fact that considerable improvements are introduced in strength.

As mentioned above, the acoustic diaphragm according to the present invention has a reduced content of impurities such as beryllium oxide (BeO) compared to the conventional diaphragm obtained by hot-rolling or hot-pressing, and has the plane $(11\bar{2}0)$ kept in parallel with the surface of the diaphragm, so that it excels in mechanical strength without any deterioration of its physical properties such as Young's modulus.

What is claimed is:

1. An accoustic diaphragm having a surface, and being formed of a material selected from the group consisting of beryllium, or an alloy consisting of at least 85% by weight of beryllium with the rest consisting of aluminium, copper, zinc titanium and/or silver, said diaphragm having a crystal structure such that only the plane $(11\bar{2}0)$ thereof is oriented parallel to the surface of the diaphragm.

* * * * *